(12) United States Patent
Kitagawa

(10) Patent No.: US 8,436,657 B2
(45) Date of Patent: May 7, 2013

(54) SEMICONDUCTOR DEVICE HAVING OUTPUT DRIVER

(75) Inventor: Katsuhiro Kitagawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 392 days.

(21) Appl. No.: 12/708,734

(22) Filed: Feb. 19, 2010

(65) Prior Publication Data

US 2011/0169527 A1      Jul. 14, 2011

(30) Foreign Application Priority Data

Jan. 8, 2010   (JP) .................................. 2010-002973

(51) Int. Cl.
*H03K 19/0175* (2006.01)
*H03L 7/06* (2006.01)

(52) U.S. Cl.
USPC .................................. 326/82; 326/86; 326/93

(58) Field of Classification Search ............ 326/82, 326/83, 86, 93, 95, 96; 327/149, 158
See application file for complete search history.

(56) References Cited

U.S. PATENT DOCUMENTS 7,133,318 B2 * 11/2006 Chung et al. ............. 365/189.05
7,224,179 B2 *  5/2007 Kim ................................ 326/26
7,598,785 B2 * 10/2009 Im et al. ....................... 327/170

FOREIGN PATENT DOCUMENTS

JP         2007-116574          5/2007

* cited by examiner

*Primary Examiner* — Daniel D Chang
(74) *Attorney, Agent, or Firm* — Young & Thompson

(57) ABSTRACT

To provide an output driver that outputs read data to outside and a mode register that sets a swing capability of the output driver. A transition start timing of the read data driven by the output driver is made relatively earlier when a swing capability of the output driver set by the mode register is set to be relatively large, and the transition start timing is relatively delayed when the swing capability of the output driver set by the mode register is set to be relatively small. With this configuration, a timing when the read data exceeds a threshold level can be caused to coincide with a desired timing regardless of the swing capability of the output driver.

13 Claims, 8 Drawing Sheets

SEMICONDUCTOR DEVICE HAVING OUTPUT DRIVER

BACKGROUND OF THE INVENTION

1. Field of the Invention

The present invention relates to a semiconductor device, and more particularly relates to a semiconductor device having an output driver with a variable swing capability.

2. Description of Related Art

Recently, synchronous memories that operate in synchronization with clock signal are widely used as main memories for personal computers or the like. According to one of the synchronous memories, that is, a DDR (Double Data Rate) synchronous memory, input/output data needs to be accurately in synchronization with external clock signal. Therefore, it is essential to provide a DLL (Delay Locked Loop) circuit that generates internal clock signal in synchronization with external clock signal (see Japanese Patent Application Laid-open No. 2007-116574).

The DLL circuit includes a replica driver that is a replica of an output driver and functions to monitor a phase of a replica clock signal outputted from the replica driver to cause a phase of read data outputted from the output driver to coincide with a phase of the external clock signal.

The read data outputted from the output driver is supplied to a memory controller that is a chip different from a synchronous memory chip. Accordingly, the output driver needs to drive a load possessed by a transmission line that connects the synchronous memory to the memory controller. However, the load of the transmission line varies depending on used systems and is not necessarily uniform even within a same system. Therefore, for example, in a DDR3 synchronous memory, a swing capability of an output driver is made variable by changing a set value of a mode register, thereby maintaining a substantially fixed data slew rate.

However, when a swing capability of the output driver is changed, the time required from a transition start timing of the read data to when the read data reaches a threshold level (a boundary level between a high level and a low level) is also changed. That is, when the swing capability of the output driver is increased, the slew rate of outputted read data is also increased (that is, rise or fall of the read data becomes sharp). The time required from the transition start timing of the read data to when the read data reaches the threshold level is thus shortened. On the other hand, when the swing capability of the output driver is decreased, the slew rate of the outputted read data is also decreased (that is, rise or fall of the read data becomes gentle). The time required from the transition start timing of the read data to when the read data reaches the threshold level is thus extended.

Meanwhile, in conventional semiconductor devices, the swing capability of replica drivers is fixed. Therefore, when a swing capability of an output driver is changed, askew occurs in read data. Specifically, the timing when the read data exceeds a threshold level becomes earlier than a desired timing when the swing capability of the output driver is increased. On the other hand, when the swing capability of the output driver is decreased, the timing is delayed with respect to a desired timing.

Japanese Patent Application Laid-open No. 2007-116574 discloses a technique of changing a delay amount of replica clock signals based on a result of a calibration operation for adjusting an impedance of an output driver. However, measures against a case that a swing capability of the output driver is switched by changing a set value of the mode register are not disclosed. Furthermore, because the impedance adjustment based on a calibration operation is a fine adjustment operation for canceling changes in temperature and variations in voltage, the method described in Japanese Patent Application Laid-open No. 2007-116574 cannot deal with a case that output characteristics change greatly like when the swing capability of the output driver is changed. Further, the method described in Japanese Patent Application Laid-open No. 2007-116574 requires a variable delay circuit to be added to a clock tree through which a replica clock signal propagates. Therefore, the symmetry between the delay amount of a clock tree from a DLL circuit to the output driver (a normal tree) and the delay amount of a clock tree from the DLL circuit to a replica driver (a replica tree) is hardly ensured.

The problems described above are not specific problems of memory devices such as synchronous memories, but are common to semiconductor devices including an output driver with a variable swing capability.

SUMMARY

In one embodiment, there is provided a semiconductor device comprising: a DLL circuit that receives a first clock signal and generates a second clock signal whose phase is controlled with respect to the first clock signal; an output driver that outputs data in synchronization with the second clock signal; and a mode register that indicates a swing capability of the output driver, wherein the DLL circuit includes: a delay line that delays the first clock signal to generate the second clock signal; a replica driver that is a replica of the output driver and receives the second clock signal to generate a third clock signal; a phase determination circuit that compares a phase of the first clock signal to a phase of the third clock signal; and a control circuit that adjusts a delay amount of the delay line based on a determination result of the phase determination circuit, and wherein a swing capability of the replica driver is variable based on a swing capability of the output driver indicated in the mode register.

In another embodiment, there is provided a semiconductor device comprising: a DLL circuit that generates an internal clock signal whose phase is controlled; an output driver that outputs data in synchronization with the internal clock signal; and a mode register that indicates a swing capability of the output driver, wherein the DLL circuit makes a phase of the internal clock signal relatively earlier when a swing capability of the output driver indicated in the mode register is set to be relatively large and, the DLL circuit relatively delays the phase of the internal clock signal when a swing capability of the output driver indicated in the mode register is set to be relatively small.

In still another embodiment, there is provided a semiconductor device comprising: an output driver that outputs data to outside; and a mode register that indicates a swing capability of the output driver, wherein a transition start timing of the data driven by the output driver is made relatively earlier when a swing capability of the output driver indicated in the mode register is set to be relatively large, and the transition start timing is relatively delayed when the swing capability of the output driver indicated in the mode register is set to be relatively small.

In the present invention, the "swing capability" of the output driver includes so-called driver strength. The driver strength indicates a current supply capability of an output driver specified by output driver impedance control set in A1 and A5 bits of a mode register MR1 in the DDR3 standard defined by JEDEC. Note that, in the present invention, the "swing capability" of an output driver is not limited to the driver strength but includes any parameters that can change a slew rate of outputted data. Therefore, as long as the "swing capability" of an output driver is variable by changing a set value of a mode register, the "swing capability" of an output driver can be a slew rate itself.

According to the present invention, the transition start timing of data is changed depending on a swing capability of an output driver set by a mode register. Therefore, the timing when output data exceeds a threshold level can be caused to coincide with a desired timing regardless of the swing capability of the output driver.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
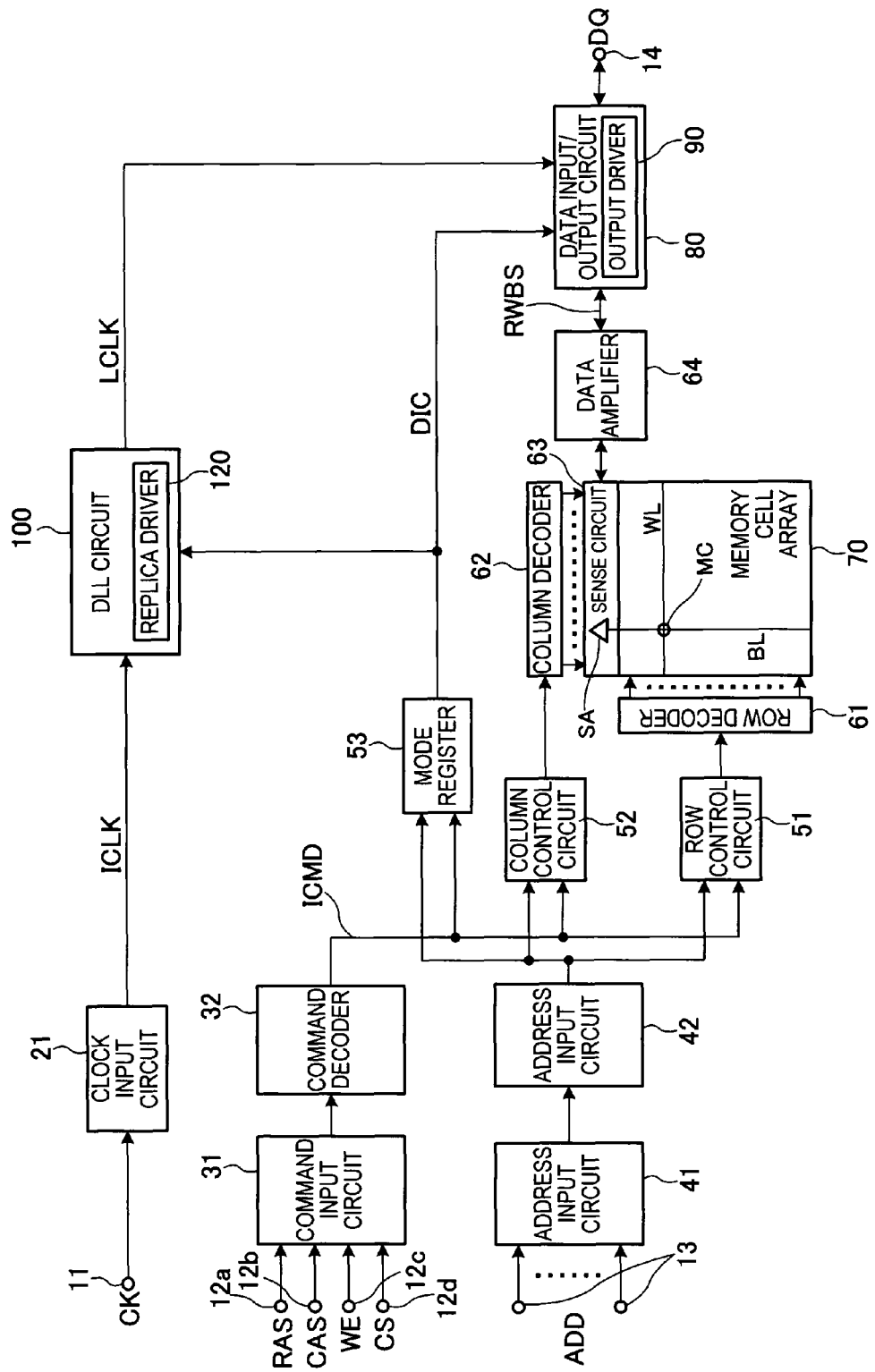
FIG. 1 is a block diagram showing a configuration of a semiconductor device 10 according to an embodiment of the present invention.

FIG. 1 is a block diagram showing a configuration of a semiconductor device 10 according to an embodiment of the present invention.

The semiconductor device 10 according to the present embodiment is a synchronous DRAM (Dynamic Random Access Memory) and includes, as external terminals, a clock terminal 11, command terminals 12a to 12d, address terminals 13, and a data input/output terminal 14. While other elements such as a data strobe terminal and a power supply terminal are also provided in addition to these terminals, illustrations thereof are omitted.

An external clock signal CK is supplied to the clock terminal 11. The supplied external clock signal CK is then supplied to a clock input circuit 21. The clock input circuit receives the external clock signal CK to generate an internal clock signal ICLK (a first clock signal) and supplies the generated signal to a DLL circuit 100. The DLL circuit 100 functions to generate an internal clock signal LCLK (a second clock signal) whose phase is controlled based on the internal clock signal ICLK and to supply the generated signal to a data input/output circuit 80. Circuit configurations of the data input/output circuit 80 and the DLL circuit 100 are described later.

Command signals CMD including a row address strobe signal RAS, a column address strobe signal CAS, a write enable signal WE, and a chip select signal CS are supplied to the command terminals 12a to 12d. These command signals CMD are supplied to a command input circuit 31. The command signals CMD supplied to the command input circuit 31 are then supplied to a command decoder 32. The command decoder 32 is a circuit that holds, decodes, and counts command signals to generate various internal commands ICMD. The generated internal commands ICMD are supplied to a row control circuit 51, a column control circuit 52, and a mode register 53.

The mode register 53 sets operation parameters (such as burst length and CAS latency) of the semiconductor device 10. One of the parameters set by the mode register 53 is a parameter referred to as output driver impedance control. This parameter specifies a swing capability of an output driver included in the data input/output circuit 80. A control signal DIC is generated based on the parameter. As shown in FIG. 1, the control signal DIC is supplied to the DLL circuit 100 as well as the data input/output circuit 80.

Address signals ADD are supplied to the address terminal 13, and the supplied address signals ADD are then supplied to an address input circuit 41. Output of the address input circuit 41 is supplied to an address latch circuit 42. Among the address signals ADD latched at the address latch circuit 42, a row address is supplied to the row control circuit 51 and a column address is supplied to the column control circuit 52. When the address signal ADD is entering a mode register set based on the command signal CMD, it is supplied to the mode register 53, thereby updating the content of the mode register 53.

Output of the row control circuit 51 is supplied to a row decoder 61. The row decoder 61 is a circuit that selects any of word lines WL included in a memory cell array 70. In the memory cell array 70, a plurality of word lines WL and a plurality of bit lines BL are crossing with each other and memory cells MC are arranged at their intersections (in FIG. 1, only one word line WL, one bit line BL, and one memory cell MC are illustrated). The bit lines BL are connected to corresponding sense amplifiers SA in a sense circuit 63.

Output of the column control circuit 52 is supplied to a column decoder 62. The column decoder 62 is a circuit that selects any of the sense amplifiers SA included in the sense circuit 63. A sense amplifier SA selected by the column decoder 62 is connected to a data amplifier 64. The data amplifier 64 further amplifies read data amplified by the sense amplifier SA and supplies the further amplified read data to the data input/output circuit 80 through a read/write bus RWBS during a read operation. Meanwhile, during a write operation, write data supplied from the data input/output circuit 80 through the read/write bus RWBS is amplified and the amplified write data is supplied to the sense amplifier SA.

The data input/output terminal 14 is a terminal that outputs read data DQ and inputs write data DQ, and is connected to the data input/output circuit 80. The internal clock LCLK is supplied to the data input/output circuit 80 and the read data is outputted in synchronization with the internal clock LCLK in a read operation.

Figure 2:
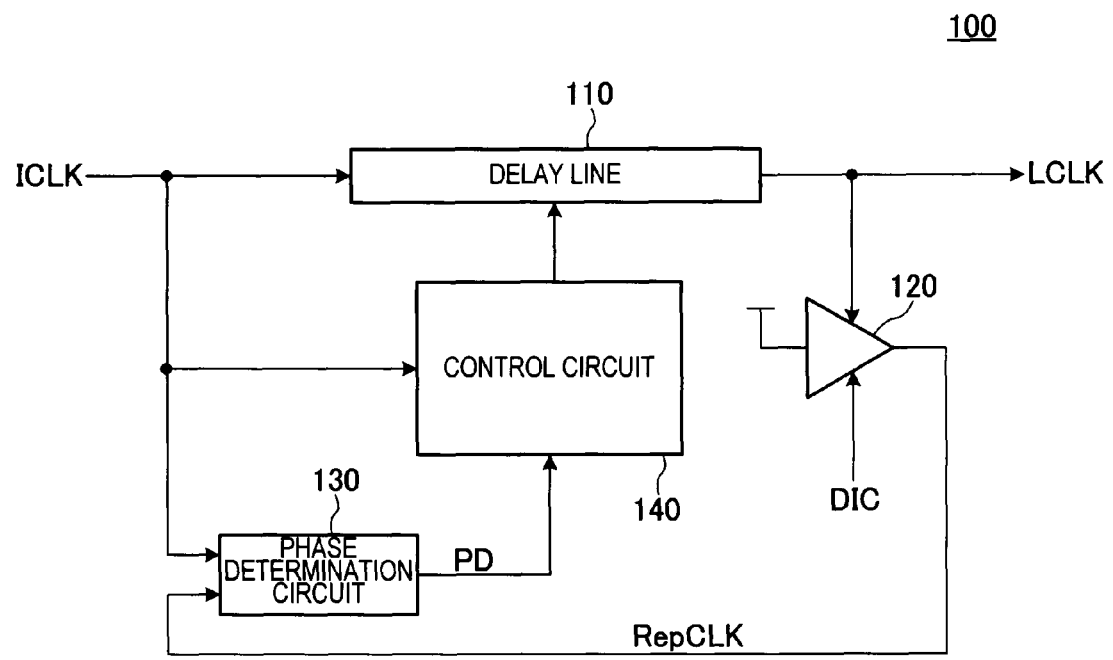
FIG. 2 is a block diagram showing a configuration of the DLL circuit 100.

FIG. 2 is a block diagram showing a configuration of the DLL circuit 100.

As shown in FIG. 2, the DLL circuit 100 includes a delay line 110, a replica driver 120, a phase determination circuit 130, and a control circuit 140.

The delay line 110 is a circuit that delays the internal clock signal ICLK (a first clock signal) to generate the internal clock signal LCLK (a second clock signal). The delay line 110 preferably includes a coarse delay line that delays external clock signals with a relatively coarse adjustment pitch and a fine delay line that delays external clock signals with a relatively fine adjustment pitch, although the delay line 110 is not particularly limited to such a configuration.

The internal clock signal LCLK is supplied to the replica driver 120 as shown in FIG. 2, as well as the data input/output circuit 80 as shown in FIG. 1. The replica driver 120 is a replica circuit of the output driver included in the data input/output circuit 80 and receives the internal clock signal LCLK to generate a replica clock signal RepCLK (a third clock signal).

The phase determination circuit 130 detects phases of the internal clock signal ICLK and the replica clock signal RepCLK. While the phase of the replica clock signal RepCLK is adjusted to coincide with that of the read data DQ by the delay line 110, their phases change with time because of variations in parameters that affect a delay amount of the delay line 110 such as voltages and temperatures and variations infrequency of the external clock signal CK. The phase determination circuit 130 detects such changes and determines whether the replica clock signal RepCLK is ahead of the internal clock signal ICLK or delayed with respect thereto. The determination is performed every period of the internal clock signal ICLK and the result is supplied to the control circuit 140 as a phase determination signal PD, although the determination is not particularly limited thereto.

The control circuit 140 sets the delay amount of the delay line 110. Whether a count value is increased or decreased is determined based on the phase determination signal PD supplied from the phase determination circuit 130. Specifically, when the phase determination signal PD indicates that the phase of the replica clock signal RepCLK is ahead of the internal clock signal ICLK, the control circuit 140 counts up the count value, thereby increasing the delay amount of the delay line 110. On the other hand, when the phase determination signal PD indicates that the phase of the replica clock signal RepCLK is delayed with respect to the internal clock signal ICLK, the control circuit 140 counts down the count value, thereby reducing the delay amount of the delay line 110. The count value is updated every plural periods of the internal clock signal ICLK (for example, every 16 periods), although the updating of the count value is not particularly limited thereto.

With the above configuration, the DLL circuit 100 is operated such that the phase of the internal clock signal ICLK coincides with that of the replica clock signal RepCLK. As a result, the phase of the internal clock signal ICLK (≈ the external clock signal CK) coincides with that of the read data DQ.

Figure 3:
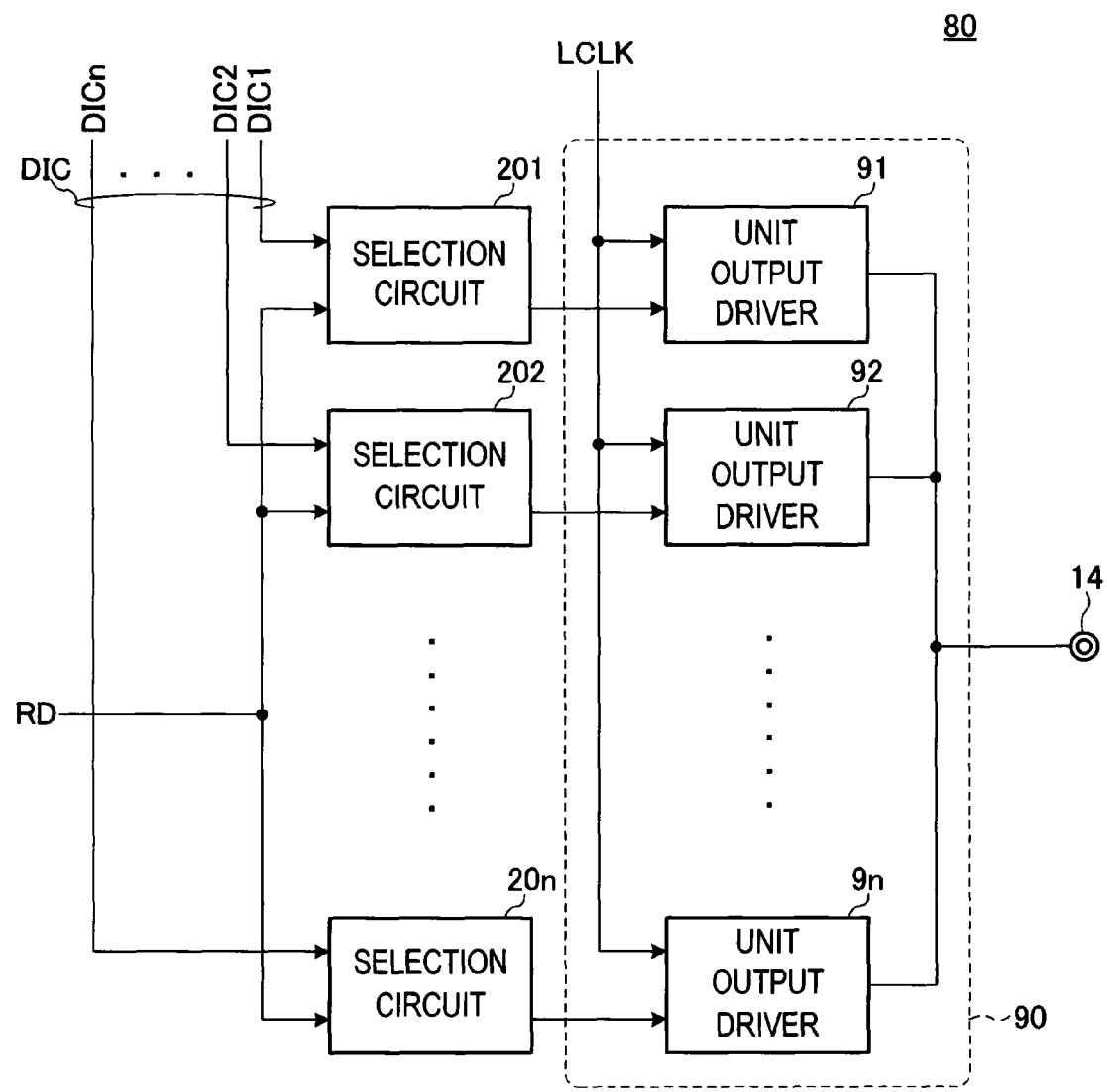
FIG. 3 is a block diagram showing a configuration of principal parts of the data input/output circuit 80.

FIG. 3 is a block diagram showing a configuration of principal parts of the data input/output circuit 80.

As shown in FIG. 3, the data input/output circuit 80 includes the output driver 90. The output driver 90 is configured to include a plurality of unit output drivers 91 to 9n, and the unit output drivers 91 to 9n are connected commonly to the input/output terminal 14. The unit output drivers 91 to 9n have commonly the same output impedance and the internal clock signal LCLK is supplied to the unit output drivers 91 to 9n as a timing signal.

Signals inputted to the respective unit output drivers 91 to 9n are supplied through corresponding selection circuits 201 to 20n. These selection circuits 201 to 20n determine whether an internal read data RD is supplied to the corresponding unit output drivers 91 to 9n. The determination is performed based on the control signal DIC supplied from the mode register 53. That is, the control signal DIC is configured by bits DIC1 to DICn corresponding to the respective selection circuits 201 to 20n. With regard to the selection circuits 201 to 20n that the corresponding bits DIC1 to DICn are activated, the internal read data RD is supplied to the corresponding unit output drivers 91 to 9n. Meanwhile, with regard to the selection circuits 201 to 20n that the corresponding bits DIC1 to DICn are not activated, the corresponding unit output drivers 91 to 9n are inactivated (in a high impedance state) regardless of the internal read data RD.

With this configuration, the number of the unit output drivers 91 to 9n to be activated is determined based on the control signal DIC. In other words, the swing capability of the output driver can be switched based on the control signal DIC. Specifically, if it is assumed that the number of unit output drivers 91 to 9n constituting the output driver 90 is n, the swing capability of the output driver can be switched between n steps.

Figure 4:
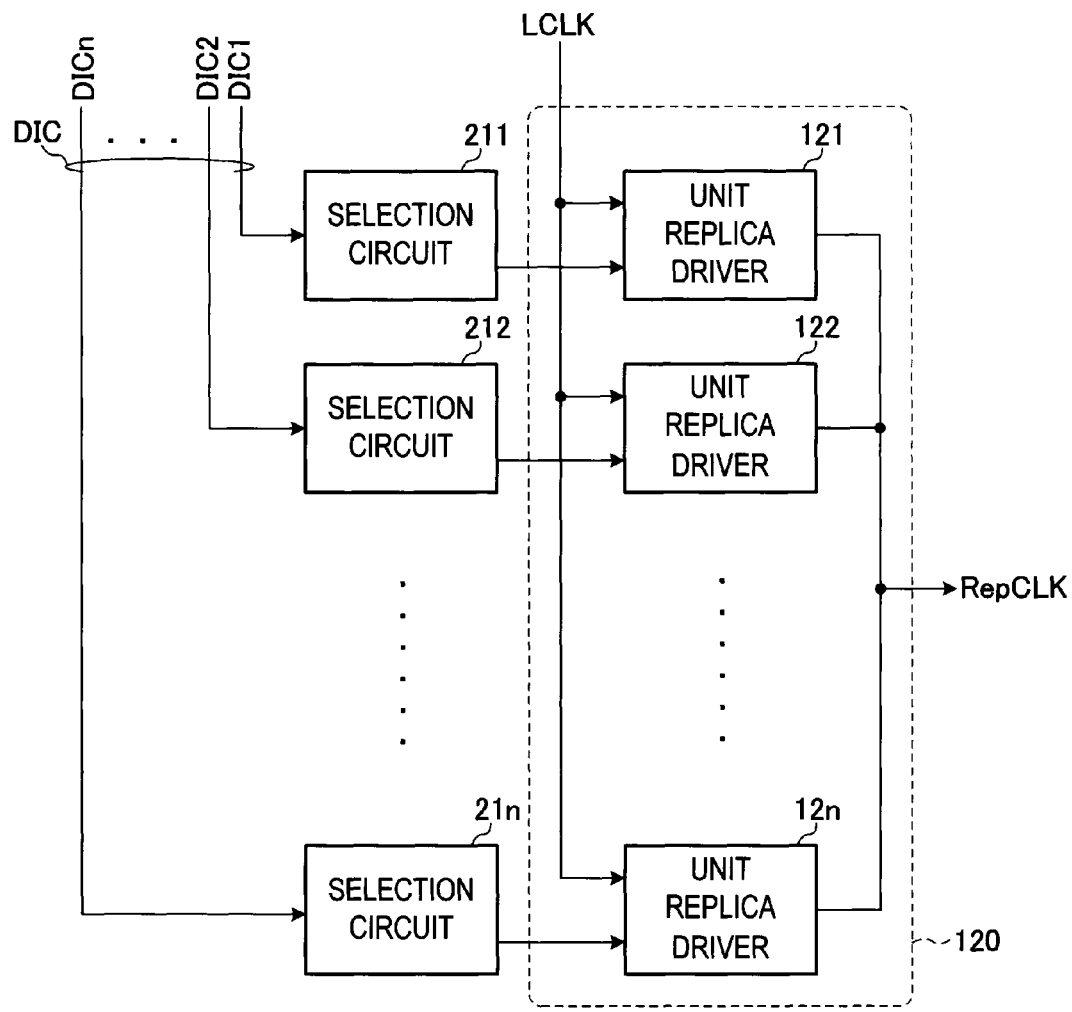
FIG. 4 is a block diagram showing a configuration of the replica driver 120.

FIG. 4 is a block diagram showing a configuration of the replica driver 120.

As shown in FIG. 4, the configuration of the replica driver 120 is the same as that of principal parts of the data input/output circuit 80 shown in FIG. 3. That is, the replica driver 120 includes a plurality of unit replica drivers 121 to 12n connected in parallel to each other. Output of the unit replica drivers 121 to 12n is used as the replica clock signal RepCLK. The unit replica drivers 121 to 12n have commonly the same output impedance and the internal clock signal LCLK is supplied commonly to the unit replica drivers 121 to 12n as a timing signal. The output impedance of the unit replica drivers 121 to 12n is the same as that of the unit output drivers 91 to 9n.

Signals inputted to the respective unit replica drivers 121 to 12n are supplied through corresponding selection circuits 211 to 21n. These selection circuits 211 to 21n determine whether the corresponding unit replica drivers 121 to 12n are activated. The determination is performed based on the control signal DIC supplied from the mode register 53. That is, the bits DIC1 to DICn configuring the control signal DIC correspond to the selection circuits 211 to 21n. With regard to the selection circuits 211 to 21n that the corresponding bits DIC1 to DICn are activated, the corresponding unit replica drivers 121 to 12n are activated. Meanwhile, with regard to the selection circuits 211 to 21n that the corresponding bits DIC1 to DICn are not activated, the corresponding unit replica drivers 121 to 12n are inactivated (in a high impedance state).

With this configuration, the number of the unit replica drivers 121 to 12n to be activated coincides with the number of the unit output drivers 91 to 9n to be activated. The swing capability of the replica driver 120 thus coincides with the swing capability of the output driver.

Figure 5:
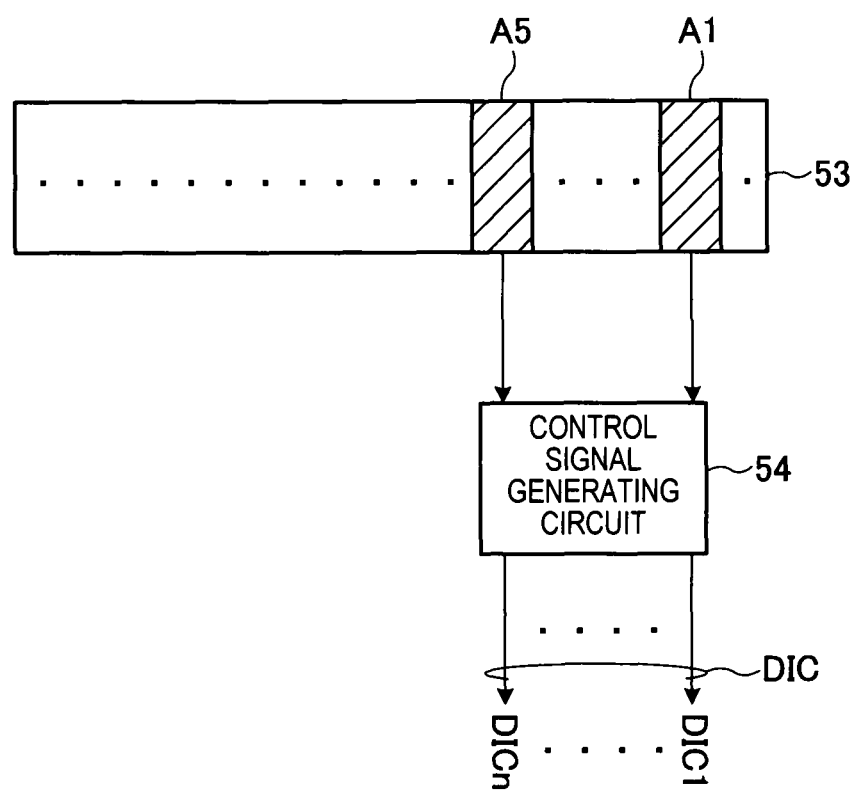
FIG. 5 is a block diagram showing a configuration of principal parts of the mode register 53.

FIG. 5 is a block diagram showing a configuration of principal parts of the mode register 53.

As shown in FIG. 5, the mode register 53 includes a plurality of bits. Among these bits, values set in an A1 bit and an A5 bit are supplied to a control signal generating circuit 54. The values set in the A1 and A5 bits are set values of the output driver impedance control and used for adjusting the current supply capability of the output driver. The control signal generating circuit 54 receives the values set in the A1 and A5 bits in the mode register 53 to generate the control signal DIC based on the values. Specifically, when the set value of the output driver impedance control indicates stronger driver strength, more bits of the bits DIC1 to DICn configuring the control signal DIC are activated. In this manner, the number of the unit output drivers 91 to 9n to be activated can be changed based on the set value of the output driver impedance control. As described above, when the number of the unit output drivers 91 to 9n to be activated is changed, the number of the unit replica drivers 121 to 12n to be activated is changed correspondingly.

Figure 6:
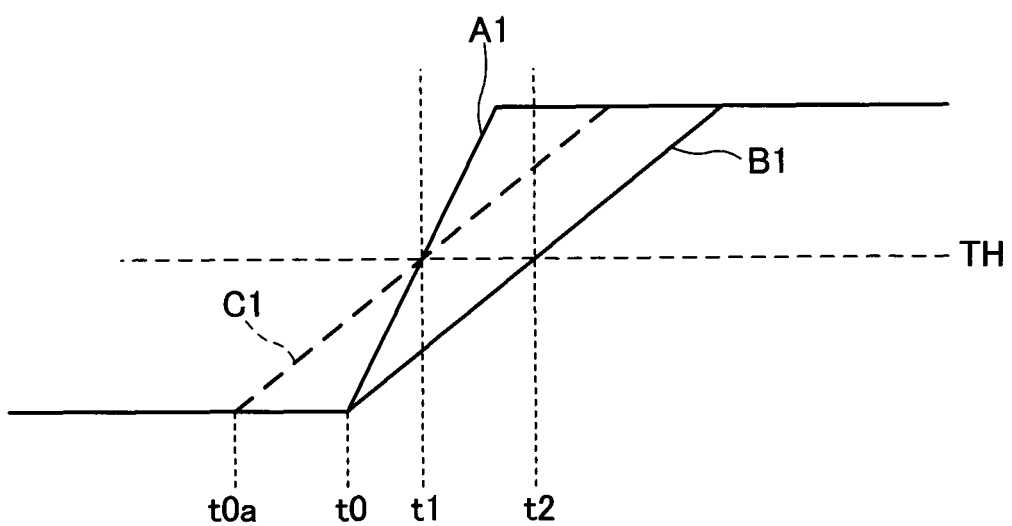
FIG. 6 is a timing diagram for explaining a relationship between the swing capability of the output driver 90 and a timing when the read data DQ exceeds a threshold level.

FIG. 6 is a timing diagram for explaining a relationship between the swing capability of the output driver 90 and a timing when the read data DQ exceeds a threshold level.

With reference to FIG. 6, a waveform A1 indicates a waveform of the read data DQ obtained when the swing capability of the output driver is relatively large. A waveform B1 indicates a waveform of the read data DQ obtained when the swing capability of the output driver is relatively small.

As shown in FIG. 6, if it is assumed that the waveforms A1 and B1 start to transition at a time t0, the timing when the read data DQ exceeds a threshold level TH (a boundary level between a high level and a low level) is at a time t1 in the waveform A1 and at a time t2 in the waveform B1, which is later than the time t1.

In a case that the swing capability of the output driver 90 is set to be small so that a slew rate is indicated by the waveform B1, when the timing when the read data DQ exceeds the threshold level TH needs to be at the time t1, transition needs to start at a time t0a, which is earlier than the time t1 as indicated by a waveform C1. That is, the timing when the read data DQ starts to transition needs to be made earlier.

Figure 7:
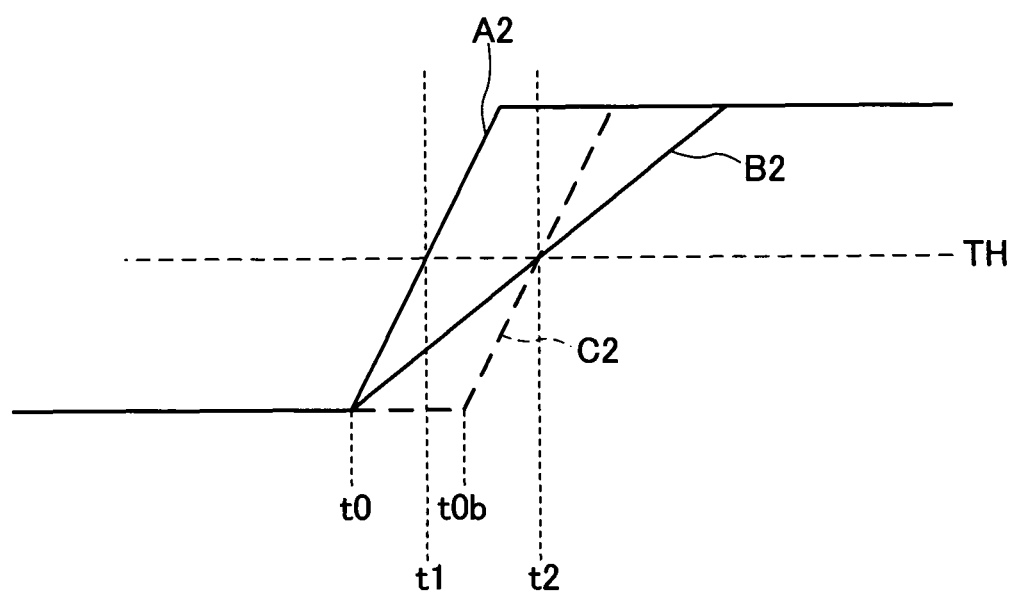
FIG. 7 is another timing diagram for explaining the relationship between the swing capability of the output driver 90 and the timing when the read data DQ exceeds the threshold level.

FIG. 7 is another timing diagram for explaining the relationship between the swing capability of the output driver 90 and the timing when the read data DQ exceeds the threshold level.

With reference to FIG. 7, a waveform A2 indicates the waveform of the read data DQ obtained when the swing capability of the output driver is relatively large. A waveform B2 indicates the waveform of the read data DQ obtained when the swing capability of the output driver is relatively small. Similarly to the example shown in FIG. 6, if it is assumed that the waveforms A2 and B2 start to transit at the time to, the timing when the read data DQ exceeds the threshold level TH (a boundary level between a high level and a low level) is at the time t1 in the waveform A2 and at the time t2 in the waveform B2, which is later than the time t1.

Therefore, in a case of setting the swing capability of the output driver 90 to be large so that the slew rate is indicated by the waveform A2, when the timing when the read data DQ exceeds the threshold level TH needs to beat the time t2, transition needs to start at a time t0b, which is later than the time t0 as indicated by a waveform C2. That is, the transition start timing of the read data DQ needs to be delayed.

According to the present embodiment, such adjustment of the transition start timing of output data is automatically performed by changing the swing capability of the replica driver 120. This adjustment is explained below.

Figure 8:
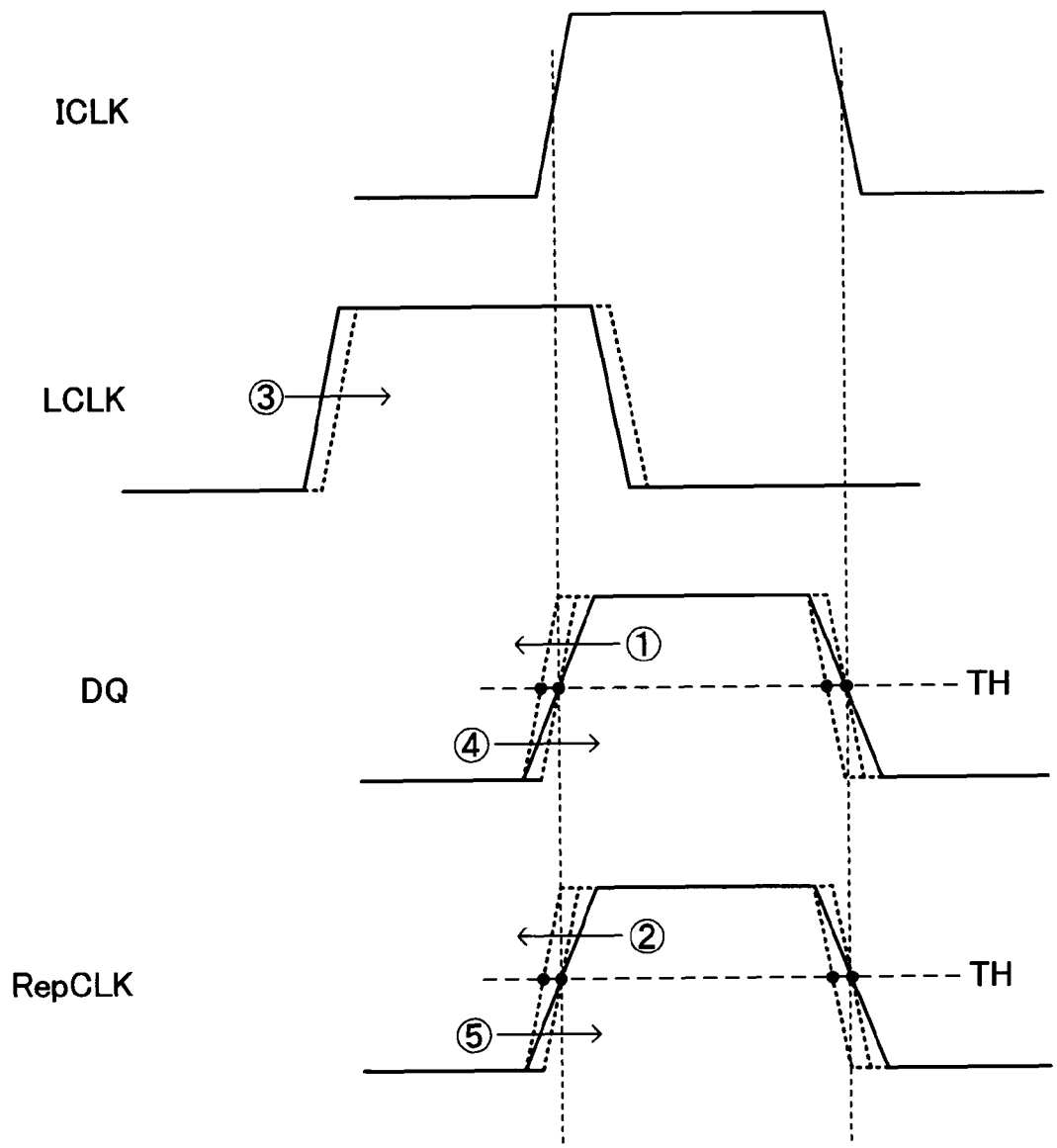
FIG. 8 is a timing diagram for explaining an operation of the semiconductor device 10 according to the present embodiment.

FIG. 8 is a timing diagram for explaining an operation of the semiconductor device 10 according to the present embodiment.

As shown in FIG. 8, the phases of the read data DQ and the replica clock signal RepCLK accurately coincide with that of the internal clock signal ICLK the external clock signal CK) by the operation of the DLL circuit 100. More specifically, the DLL circuit 100 adjusts the delay amount of the internal clock signal LCLK by taking delays generated by signals passing thorough a clock tree and operational delays of the replica driver 120 into consideration, so that the phases of the read data DQ and the replica clock signal RepCLK coincide with that of the internal clock signal ICLK.

If it is assumed that the swing capability of the output driver 90 is increased by changing a set value of the mode register 53, the increased slew rate causes the timing when the read data DQ exceeds the threshold level earlier (see an arrow 1 shown in FIG. 8). In such a case, when the swing capability of the replica driver 120 is fixed like conventional semiconductor devices, the waveform of the replica clock signal RepCLK is not changed and thus the phase of the internal clock signal LCLK is not changed either. As a result, a skew occurs between the read data DQ and the internal clock signal ICLK.

On the other hand, in the present embodiment, because the swing capability of the replica driver 120 is changed in conjunction with the swing capability of the output driver 90, the phase of the replica clock signal RepCLK is made earlier (see an arrow 2 shown in FIG. 8). Such change in phase is detected by the phase determination circuit 130 shown in FIG. 2, so that the control circuit 140 increases the delay amount of the delay line 110 (see an arrow 3 shown in FIG. 8). As a result, the transition start timings the read data DQ and the replica clock signal RepCLK are delayed, in order to coincide with the phase of the internal clock signal ICLK (see arrows 4 and 5 shown in FIG. 8).

Also in a case that the swing capability of the output driver 90 is decreased, the transition start timings the read data DQ and the replica clock signal RepCLK are made earlier. Therefore, the phases of the read data DQ and the replica clock signal RepCLK coincide with the phase of the internal clock signal ICLK.

In this manner, according to the present embodiment, when the swing capability of the output driver 90 is changed by changing a set value of the mode register 53, the swing capability of the replica driver 120 is also changed correspondingly. Accordingly, any skew does not occur in the read data DQ even when the swing capability of the output driver 90 is changed. Therefore, a high signal quality can be ensured regardless of the swing capability of the output driver 90.

Furthermore, because the swing capability of the replica driver 120 is changed automatically by changing the set value of the mode register 53, any special operation by a user is not necessary. In addition, it is not necessary to provide a variable delay circuit or the like in a clock tree through which the replica clock signal RepCLK propagates, the symmetry between the replica clock tree and a normal clock tree through which the internal clock signal LCLK propagates can be improved.

It is apparent that the present invention is not limited to the above embodiments, but may be modified and changed without departing from the scope and spirit of the invention.

For example, while the above embodiment has exemplified a case that the present invention is applied to a synchronous memory, the application target of the invention is not limited thereto, and the invention can be also applied to semiconductor devices other than memory devices.

What is claimed is:
1. A semiconductor device comprising:
a DLL circuit that receives a first clock signal and generates a second clock signal whose phase is controlled with respect to the first clock signal;
an output driver that outputs data in synchronization with the second clock signal; and
a mode register that indicates a swing capability of the output driver, wherein
the DLL circuit includes:
a delay line that delays the first clock signal to generate the second clock signal;

a replica driver that is a replica of the output driver and receives the second clock signal to generate a third clock signal;

a phase determination circuit that compares a phase of the first clock signal to a phase of the third clock signal; and a control circuit that adjusts a delay amount of the delay line based on a determination result of the phase determination circuit, and wherein a swing capability of the replica driver is variable based on a swing capability of the output driver indicated in the mode register.

2. The semiconductor device as claimed in claim 1, wherein a swing capability of the replica driver is set to be relatively large when a swing capability of the output driver indicated in the mode register is set to be relatively large, and a swing capability of the replica driver is set to be relatively small when a swing capability of the output driver indicated in the mode register is set to be relatively small.

3. The semiconductor device as claimed in claim 1, wherein the output driver is configured to have a plurality of unit output drivers connected to each other in parallel, the replica driver is configured to have a plurality of unit replica drivers connected to each other in parallel, a swing capability of the output driver is variable by changing number of unit output drivers to be activated among the unit output drivers, and a swing capability of the replica driver is variable by changing number of unit replica drivers to be activated among the unit replica drivers.

4. A semiconductor device comprising:

a DLL circuit that generates an internal clock signal whose phase is controlled;

an output driver that outputs data in synchronization with the internal clock signal; and a mode register that indicates a swing capability of the output driver, wherein the DLL circuit makes a phase of the internal clock signal relatively earlier when a swing capability of the output driver indicated in the mode register is set to be relatively large and, the DLL circuit relatively delays the phase of the internal clock signal when a swing capability of the output driver indicated in the mode register is set to be relatively small.

5. The semiconductor device as claimed in claim 4, wherein the DLL circuit includes a delay line that delays an external clock signal to generate the internal clock signal, the DLL circuit sets a delay amount of the delay line to be relatively small when a swing capability of the output driver indicated in the mode register is set to be relatively large, and the DLL circuit sets the delay amount of the delay line to be relatively large when a swing capability of the output driver indicated in the mode register is set to be relatively small.

6. The semiconductor device as claimed in claim 4, wherein the output driver is configured to have a plurality of unit output drivers connected to each other in parallel, and a swing capability of the output driver is variable by changing number of unit output drivers to be activated among the unit output drivers.

7. A semiconductor device comprising:

an output driver configured to output an output signal in response to a first clock signal; and a DLL circuit configured to receive a second clock signal and delay the second clock signal by a delay amount to produce the first clock signal, the DLL circuit including a replica driver which is a replica of the output driver, the replica driver receiving the first clock signal to control the delay amount, wherein a swing capability of the output driver is variable based on a first signal; and wherein a swing capability of the replica driver is variable based on a second signal.

8. The semiconductor device as claimed in claim 7, wherein the first and second signals are the same signal.

9. The semiconductor device as claimed in claim 7, further comprising a mode register which outputs the first and second signals.

10. The semiconductor device as claimed in claim 9, wherein the first and second signals are the same signal.

11. The semiconductor device as claimed in claim 9, further comprising:

a command decoder which inputs a command signal; and an address circuit which inputs an address signal, wherein the mode register outputs the first and second signals based on outputs from the command decoder and the address circuit.

12. The semiconductor device as claimed in claim 7, wherein the output driver includes a plurality of output driving circuits, and each of the output driving circuit outputs the output signal when activated; and wherein the output driving circuits receive different control signals so that each of the output driving circuits is individually activated.

13. The semiconductor device as claimed in claim 12, wherein the replica driver includes a plurality of replica driving circuits, and each of the replica driving circuit receives the first clock signal;

wherein each of the replica driving circuits outputs a replica clock signal when activated to control the delay amount; and wherein the replica driving circuits receive the different control signals so that each of the replica driving circuits is individually activated.

* * * * *